US008035446B1

United States Patent
Chi et al.

(10) Patent No.: US 8,035,446 B1
(45) Date of Patent: Oct. 11, 2011

(54) NATURAL SAMPLING FOR A DIGITAL CLASS-D POWER AMPLIFIER

(75) Inventors: Zhipei Chi, Sunnyvale, CA (US); Peiqi Xuan, Sunnyvale, CA (US); Runsheng He, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 1525 days.

(21) Appl. No.: 11/109,372

(22) Filed: Apr. 19, 2005

Related U.S. Application Data

(60) Provisional application No. 60/635,795, filed on Dec. 13, 2004.

(51) Int. Cl.
*H03F 1/26* (2006.01)
*H03F 1/30* (2006.01)
(52) U.S. Cl. .......................................... 330/149; 30/151
(58) Field of Classification Search .................. 330/151, 330/149
See application file for complete search history.

(56) References Cited

U.S. PATENT DOCUMENTS

| 6,606,044 B2 | 8/2003 | Roeckner et al. |
| 6,690,746 B1 * | 2/2004 | Sills et al. ..................... 375/316 |
| 2003/0122692 A1 * | 7/2003 | Roeckner et al. ............... 341/53 |

* cited by examiner

Primary Examiner — Michael B Shingleton

(57) ABSTRACT

A digital signal processor includes an up-sampling module that samples an input signal and generates up-sampling points. A natural sampling module includes a reference signal generation module that generates a reference signal. A crossing point detection module receives the up-sampling points and the reference signal and uses interpolation to detect intersection points of the input signal and the reference signal. The crossing point detection module determines values of the input signal at first and second evaluation times. The crossing point detection module estimates a current intersection point of the input signal and the reference signal as an intersection of the reference signal and a line that extends between first and second points on the input signal that correspond with the first and second evaluation times. A frequency of the reference signal is variable and a current switching period of the reference signal is not equal to a previous switching period.

44 Claims, 12 Drawing Sheets

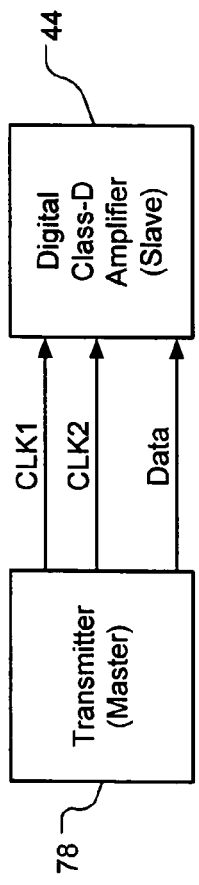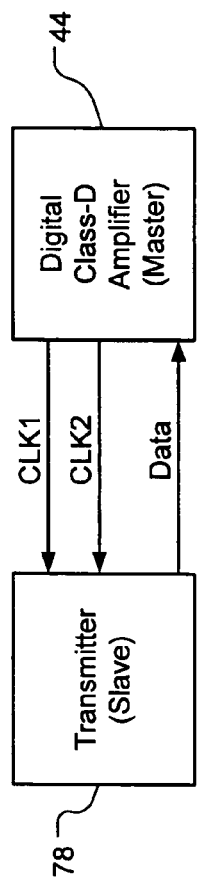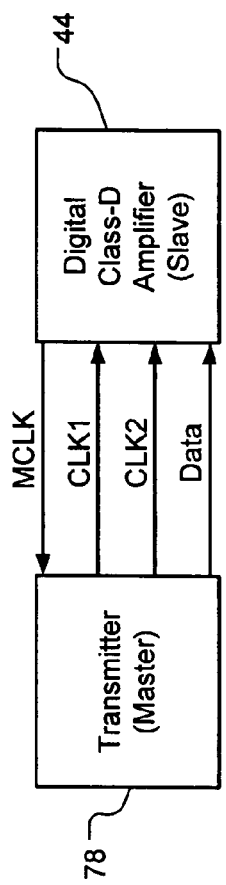

NATURAL SAMPLING FOR A DIGITAL CLASS-D POWER AMPLIFIER

CROSS-REFERENCE TO RELATED APPLICATIONS

This application claims the benefit of U.S. Provisional Application No. 60/635,795, filed on Dec. 13, 2004, which is hereby incorporated by reference in its entirety.

FIELD OF THE INVENTION

The present invention relates to power amplifiers, and more particularly to digital Class-D power amplifiers that include digital signal processors (DSPs).

BACKGROUND OF THE INVENTION

Amplifiers are typically used to amplify low-level audio signals in order to drive audio speakers such as headphones, loudspeakers, and/or other audio devices. Class-D amplifiers have a relatively high efficiency and are particularly applicable to portable audio devices. However, Class-D amplifiers are also used in non-portable audio applications. Class-D amplifiers include power transistors that are operated in either a fully-on or a fully-off state. A Class-D amplifier generates an amplified binary signal that conveys the same information as a digital input signal.

Referring to FIGS. 1 and 2, an exemplary Class-D amplifier 10 includes a digital signal processor (DSP) 12 that receives a digital audio input signal. The DSP 12 amplifies the input signal and generates a pulse width modulated (PWM) signal based on the input signal. In an exemplary embodiment, the amplifier 10 is a tri-state amplifier 10, and the PWM signal consists of three values. For example, the values may be −1, 0, and +1. A sourcing transistor 14, a sinking transistor 16, and a ground transistor 18 all receive the PWM signal. The sourcing transistor 14 communicates with a positive supply potential $V_{dd}$, the sinking transistor 16, and the ground transistor 18. The sinking transistor 16 communicates with a negative supply potential $-V_{dd}$, the sourcing transistor 14, and the ground transistor 18. The ground transistor 18 communicates with a ground potential, the sourcing transistor 14, and the sinking transistor 16.

The PWM waveform functions as a digital control signal that switches the sourcing and sinking transistors 14 and 16, respectively, on and off based on the amplitude of the input signal. The gain of the amplifier 10 is adjusted by varying the value of the positive and negative supply potentials. The sourcing and sinking transistors 14 and 16, respectively, generate a high-power version of the PWM waveform, which includes components of the input signal as well as components resulting from the PWM conversion process. Therefore, a low-pass filter 20 receives the amplified PWM waveform. The low-pass filter 20 outputs lower frequency signals while restricting higher frequency signals. The low-pass filter 20 also has the effect of smoothing transitions in the amplified PWM waveform.

The filtered waveform is received by a load 22 that communicates with a ground potential. For example, the load 22 may be an audio speaker. The ground transistor 18 is turned on in order to ground the common node between the sourcing and sinking transistors 14 and 16, respectively, the ground transistor 18, and the low-pass filter 20. In the event that the low-pass filter 20 includes one or more inductors, the ground transistor 18 provides a ground path to discharge the inductors. This prevents adverse effects to the amplifier circuit 10 that may be caused by the inductors remaining in a charged state.

The DSP 12 includes a sawtooth generator 28 that generates a sawtooth reference signal 30. As shown in FIG. 2, the DSP utilizes the sawtooth reference signal 30 to sample a digital audio input signal 32. A frequency of the sawtooth waveform 30 determines a sampling rate for the input signal 32. The DSP 12 detects intersection points of the input signal 32 and the ramp portions of the sawtooth waveform 30. The intersection points are converted into a PWM waveform 34. The PWM waveform 34 includes positive pulses 36 and negative pulses 38. The amplitudes of the pulses 36 and 38 are equal to the supply potential of the amplifier 10.

Intersection points that are located below zero are converted into negative pulses 38 in the PWM waveform 34. Intersection points that are located above zero are converted into positive pulses 34. Positive pulses 36 begin at reference times of the sawtooth waveform 30. For example, the reference times may occur at points where the ramp portions of the sawtooth waveform 30 are equal to zero. Positive pulses 36 end at respective intersection points of the input signal 32 and the sawtooth waveform 30. Negative pulses 38 begin at intersection points that are located below zero and end at respective reference times of the sawtooth waveform 30. This results in the PWM waveform 34, which exhibits one of three states.

In one approach, DSPs 12 for Class-D digital power amplifiers 10 generate the PWM waveform 36 by comparing the digital input audio signal 32 and the sawtooth waveform 30. However, the DSP 12 may also include an up-sampling module that adjusts a frequency at which the input signal 32 is sampled. In this case, the up-sampling module generates sampling points, which makes it difficult to compare the input signal 32 and the sawtooth waveform 30. Also, an abundance of near zero amplitudes at intersection points of the input signal 32 and sawtooth waveform 30 may adversely affect analog circuitry in the amplifier 10.

SUMMARY OF THE INVENTION

A digital signal processor (DSP) according to the present invention includes an up-sampling module that samples an input signal and that generates up-sampling points. A natural sampling module includes a reference signal generation module that generates a reference signal. A crossing point detection module receives the up-sampling points and the reference signal and uses interpolation to detect intersection points of the input signal and the reference signal.

In other features, the crossing point detection module determines first and second values of the input signal at first and second evaluation times, respectively. The crossing point detection module estimates a current intersection point of the input signal and the reference signal as an intersection point of the reference signal and a line that extends between first and second points on the input signal that correspond with the first and second evaluation times, respectively. The first evaluation time is offset from a current reference time by a first time offset. The first time offset is equal to a difference between a time of a previous intersection point of the input signal and the reference signal in a previous switching period of the reference signal and a previous reference time in the previous switching period. A frequency of the reference signal is variable. The second evaluation time is offset from the first evaluation time by a second time offset.

In still other features of the invention, the input signal is a digital audio signal. A frequency of the reference signal is constant. The reference signal is a sawtooth waveform. The intersection points are points where the input signal intersects ramp portions of the sawtooth waveform. The crossing point detection module uses LaGrangian polynomial interpolation to determine the first and second values of the input signal based on the up-sampling points.

In yet other features, a pulse width modulation (PWM) module receives the intersection points of the reference signal and the input signal and converts the intersection points into a PWM waveform having pulses with widths that correspond with differences between times of the intersection points and respective reference times. The pulses are negative when values of the input signal at the intersection points are less than or equal to zero. The pulses are positive when values of the input signal at the intersection points are greater than zero. The PWM module adds an additional pulse waveform to each of the pulses. A first pulse includes only the additional pulse waveform when a value of the input signal at an intersection point associated with the first pulse is equal to zero.

In still other features of the invention, the PWM module adds the additional pulse waveform to beginnings of pulses that are positive and ends of pulses that are negative. The additional pulse waveform includes a first pulse that is negative and a second pulse that is positive, the first and second pulses have predetermined widths, and the first and second pulses are separated by a predetermined amount of time that is adjustable. The first pulse increases widths of pulses that are negative and the second pulse increases widths of pulses that are positive. The predetermined amount of time between the first and second pulses varies between a first occurrence of the first and second pulses and a second occurrence of the first and second pulses in the PWM waveform.

In yet other features, the first evaluation time is after the current reference time when the input signal is greater than the reference signal at the previous reference time. The first evaluation time is before the current reference time when the input signal is less than the reference signal at the previous reference time. The second evaluation time is before the first evaluation time when the input signal is less than the reference signal at the first evaluation time. The second evaluation time is after the first evaluation time when the input signal is greater than the reference signal at the first evaluation time.

In still other features of the invention, the current and previous reference times occur at points on the reference signal where a value of the reference signal is equal to zero. A third evaluation time in a subsequent switching period of the reference signal is offset from a subsequent reference time in the subsequent switching period by a second time offset. The second time offset is equal to a difference between a time of the current intersection point and the current reference time. A frequency of the reference signal is variable and a duration of a current switching period of the reference signal is not equal to a duration of a previous switching period of the reference signal. The first evaluation time is offset from a time of a previous intersection point of the reference signal and the input signal in the previous switching period by a first time offset. The first time offset is equal to an average of the duration of the current switching period and the duration of the previous switching period. A digital Class-D amplifier comprises the DSP.

A digital signal processor (DSP) includes up-sampling means for sampling an input signal and for generating up-sampling points. Natural sampling means generate natural sampling points and include reference signal generating means for generating a reference signal. Crossing point detecting means receives the up-sampling points and the reference signal and uses interpolation to detect intersection points of the input signal and the reference signal.

In other features, the crossing point detecting means determines first and second values of the input signal at first and second evaluation times, respectively. The crossing point detecting means estimates a current intersection point of the input signal and the reference signal as an intersection point of the reference signal and a line that extends between first and second points on the input signal that correspond with the first and second evaluation times, respectively. The first evaluation time is offset from a current reference time by a first time offset. The first time offset is equal to a difference between a time of a previous intersection point of the input signal and the reference signal in a previous switching period of the reference signal and a previous reference time in the previous switching period. A frequency of the reference signal is variable. The second evaluation time is offset from the first evaluation time by a second time offset.

In still other features of the invention, the input signal is a digital audio signal. A frequency of the reference signal is constant. The reference signal is a sawtooth waveform. The intersection points are points where the input signal intersects ramp portions of the sawtooth waveform. The crossing point detecting means uses LaGrangian polynomial interpolation to determine the first and second values of the input signal based on the up-sampling points.

In yet other features, pulse width modulating means receive the intersection points of the reference signal and the input signal and convert the intersection points into a PWM waveform having pulses with widths that correspond with differences between times of the intersection points and respective reference times. The pulses are negative when values of the input signal at the intersection points are less than or equal to zero. The pulses are positive when values of the input signal at the intersection points are greater than zero. The pulse width modulating means adds an additional pulse waveform to each of the pulses. A first pulse includes only the additional pulse waveform when a value of the input signal at an intersection point associated with the first pulse is equal to zero.

In still other features of the invention, the pulse width modulating means adds the additional pulse waveform to beginnings of pulses that are positive and ends of pulses that are negative. The additional pulse waveform includes a first pulse that is negative and a second pulse that is positive, the first and second pulses have predetermined widths, and the first and second pulses are separated by a predetermined amount of time that is adjustable. The first pulse increases widths of pulses that are negative and the second pulse increases widths of pulses that are positive. The predetermined amount of time between the first and second pulses varies between a first occurrence of the first and second pulses and a second occurrence of the first and second pulses in the PWM waveform.

In yet other features, the first evaluation time is after the current reference time when the input signal is greater than the reference signal at the previous reference time. The first evaluation time is before the current reference time when the input signal is less than the reference signal at the previous reference time. The second evaluation time is before the first evaluation time when the input signal is less than the reference signal at the first evaluation time. The second evaluation time is after the first evaluation time when the input signal is greater than the reference signal at the first evaluation time.

In still other features of the invention, the current and previous reference times occur at points on the reference signal where a value of the reference signal is equal to zero. A third evaluation time in a subsequent switching period of the reference signal is offset from a subsequent reference time in the subsequent switching period by a second time offset. The second time offset is equal to a difference between a time of the current intersection point and the current reference time. A frequency of the reference signal is variable and a duration of a current switching period of the reference signal is not equal to a duration of a previous switching period of the reference signal. The first evaluation time is offset from a time of a previous intersection point of the reference signal and the input signal in the previous switching period by a first time offset. The first time offset is equal to an average of the duration of the current switching period and the duration of the previous switching period. A digital Class-D amplifier comprises the DSP.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4A is a functional block diagram of the amplifier as a slave device and an external device as a master device with respect to clock signal generation;

FIG. 4B is a functional block diagram of the amplifier as a master device and the external device as a slave device;

FIG. 4C is a functional block diagram of the amplifier as a modified slave device that originates the clock signal when the external device is a master device;

DETAILED DESCRIPTION OF THE PREFERRED EMBODIMENTS

Figure 1:
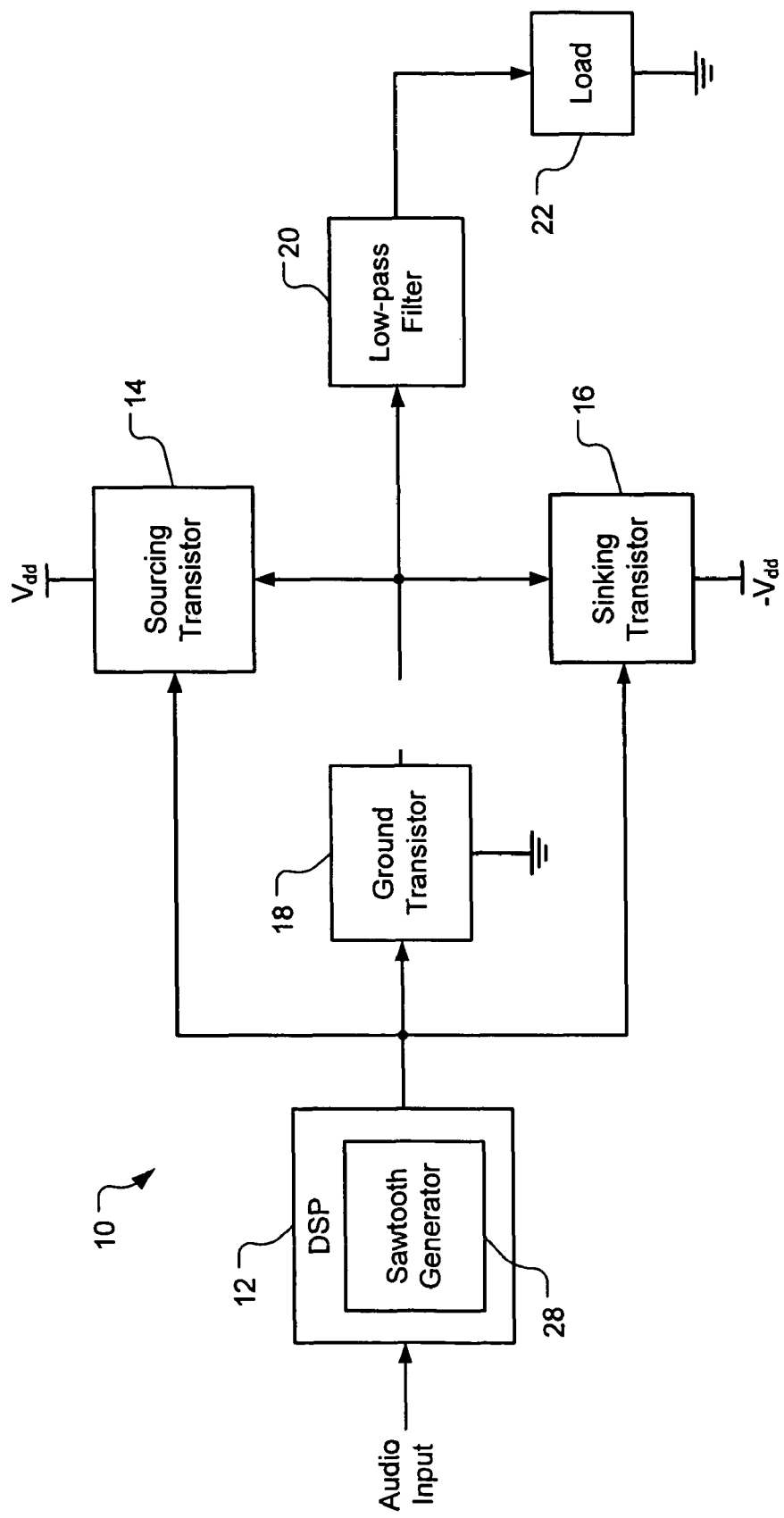
FIG. 1 is a functional block diagram of a tri-state Class-D digital power amplifier according to the prior art.
Figure 2:
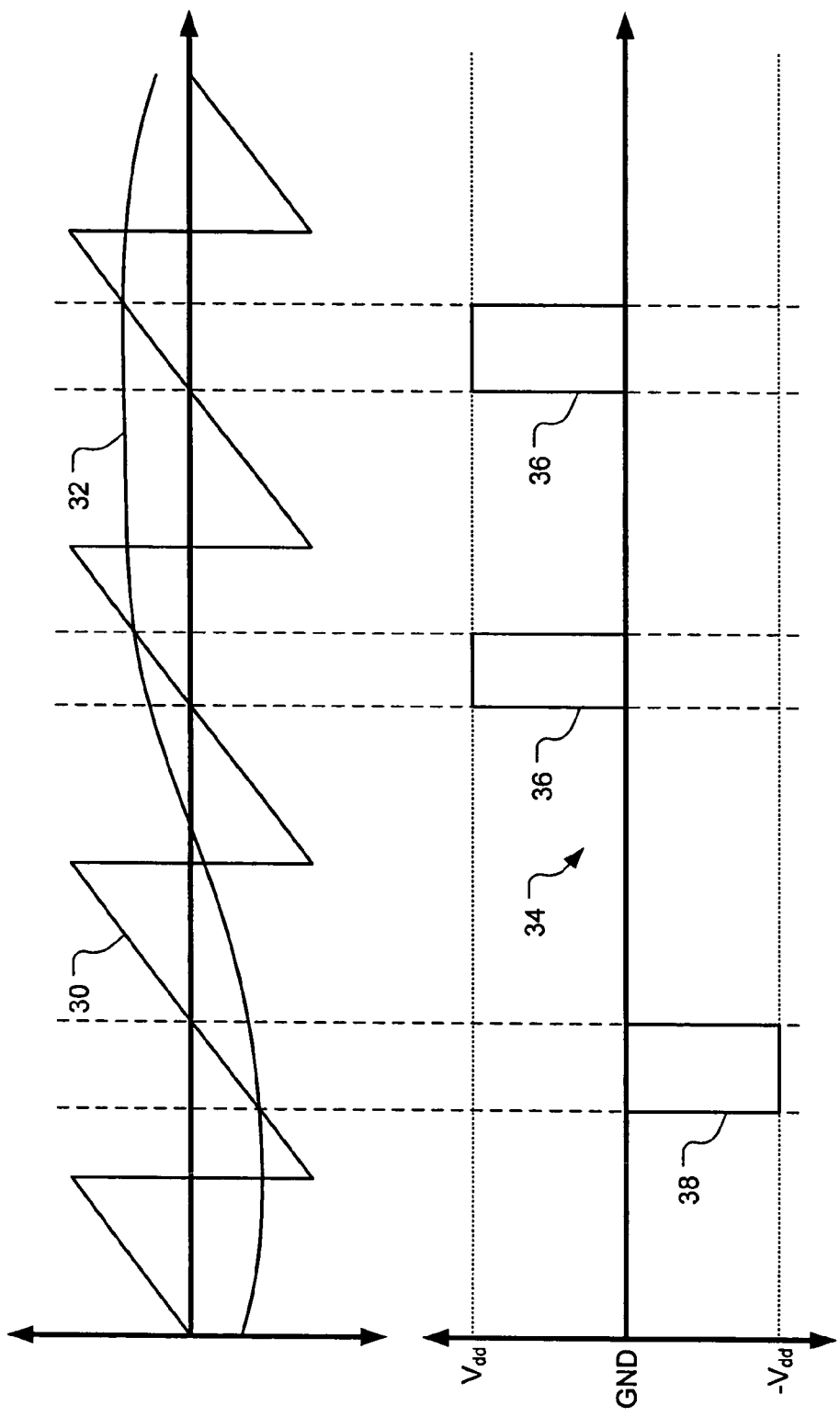
FIG. 2 is a graph illustrating a digital audio input signal that is sampled and converted into a pulse width modulated (PWM) waveform according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module and/or device refers to an application specific integrated circuit (ASIC), an electronic circuit, a processor (shared, dedicated, or group) and memory that execute one or more software or firmware programs, a combinational logic circuit, and/or other suitable components that provide the described functionality.

Figure 3:
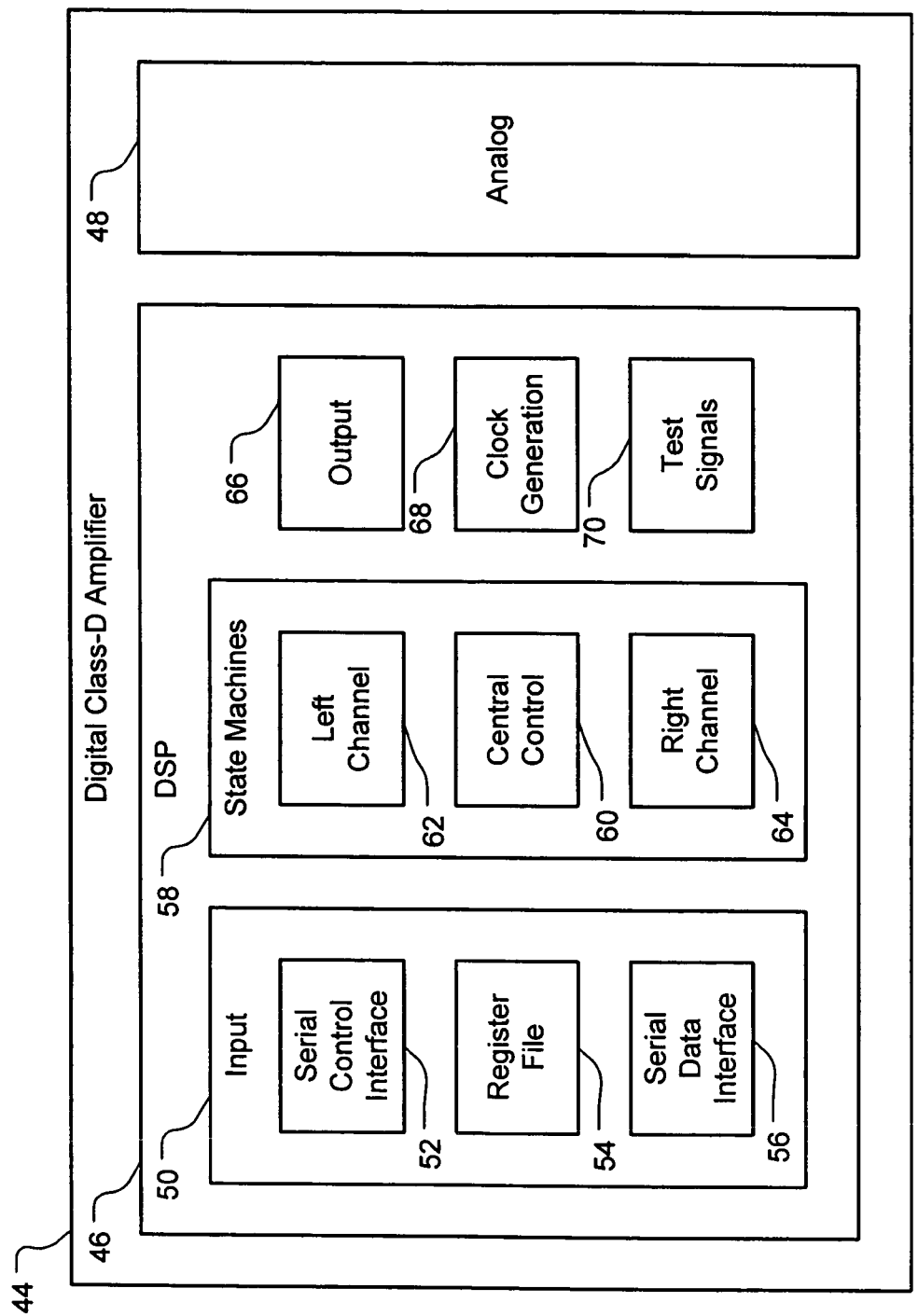
FIG. 3 is a functional block diagram of a system architecture for a digital Class-D power amplifier according to the present invention.

Referring now to FIG. 3, an exemplary digital Class-D power amplifier 44 according to the present invention includes a digital signal processor (DSP) 46 and an analog module 48. The DSP 46 receives a digital audio input signal and converts the input signal into a pulse width modulated (PWM) waveform. The PWM waveform is received by the analog module 48 and acts as a control signal for transistors in the analog module 48. The analog module 48 generates an amplified and filtered waveform based on the PWM waveform. The filtered waveform is received by a load such as an audio speaker to produce an audible signal.

The DSP 46 includes an input module 50 that serves as an interface between external devices and the remaining components of the amplifier 44. The input module 50 includes a serial control interface 52, a register file 54, and a serial data interface 56. For example, the serial control interface 52 may include a 3-wire serial control interface, a 2-wire serial control interface, or another kind of interface 52. The serial control interface 52 programs registers located in the register file 54. The serial control interface 52 also sends/receives control signals throughout the DSP 46. Relevant parameters relating to the amplifier 44 are stored in the register file 54. For example, the register file 54 is programmed in order to play or mute music. This allows other components of the amplifier 44 and detect a play request, mute request, or another request.

The serial data interface 56 loads audio input signals into the amplifier 44. For example, the serial data interface 56 may include a 3-wire serial data interface or another kind of interface 56. A control module 58 includes a central control module 60, a left channel module 62, and a right channel module 64. Signal flow through the DSP 46 is controlled by the central control module 60.

The central control module 60 generates control signals for both the right and left channels. Additionally, the right and left channel modules 64 and 62, respectively, control respective arithmetic logic units (ALUs), read and write to respective memory locations, and perform housekeeping operations. The DSP 46 includes an output module 66 that converts sampled points of the input signal into a PWM waveform. A clock generation module 68 generates system clocks and receives master clock signals from external devices. A test signal module 70 generates test signals that are used to verify proper operation of components in the amplifier 44.

Referring now to FIGS. 4A-4C, the clock generation module 68 facilitates operation of the amplifier 44 in one of any number of modes with respect to clock generation. In FIG. 4A, the amplifier 44 is a slave device and an external device 78 is a master device. In this scenario, the external device 78 generates one or more clock signals and transmits the clock signals along with a data signal to the amplifier 44. For example, the external device 78 transmits two clock signals having different frequencies to the amplifier 44 in FIG. 4A. The amplifier 44 receives the clocks signals from the external device 78 and latches the data from the data signal. In FIG. 4B, the amplifier 44 is a master device and the external device 78 is a slave device. In this scenario, the amplifier 44 generates one or more clock signals and transmits the clock signals to the external device 78. The external device 78 receives the clock signals from the amplifier 44 and transmits a data signal to the amplifier 44. The amplifier 44 latches the data from the data signal.

In FIG. 4C, the amplifier 44 is a slave device and the external device 78 is a master device. However, in this scenario the amplifier 44 generates the master clock signal. The amplifier 44 transmits the master clock signal to the external device 78. The external device 78 receives the master clock signal and generates one or more clock signals and a data signal. The external device 78 transmits the clock signals and the data signal to the amplifier 44. The amplifier 44 latches the data from the data signal. The configuration illustrated in FIG. 4C is useful for amplifiers 44 that are required to generate a master clock and that are required to operate as slave devices.

Figure 5:
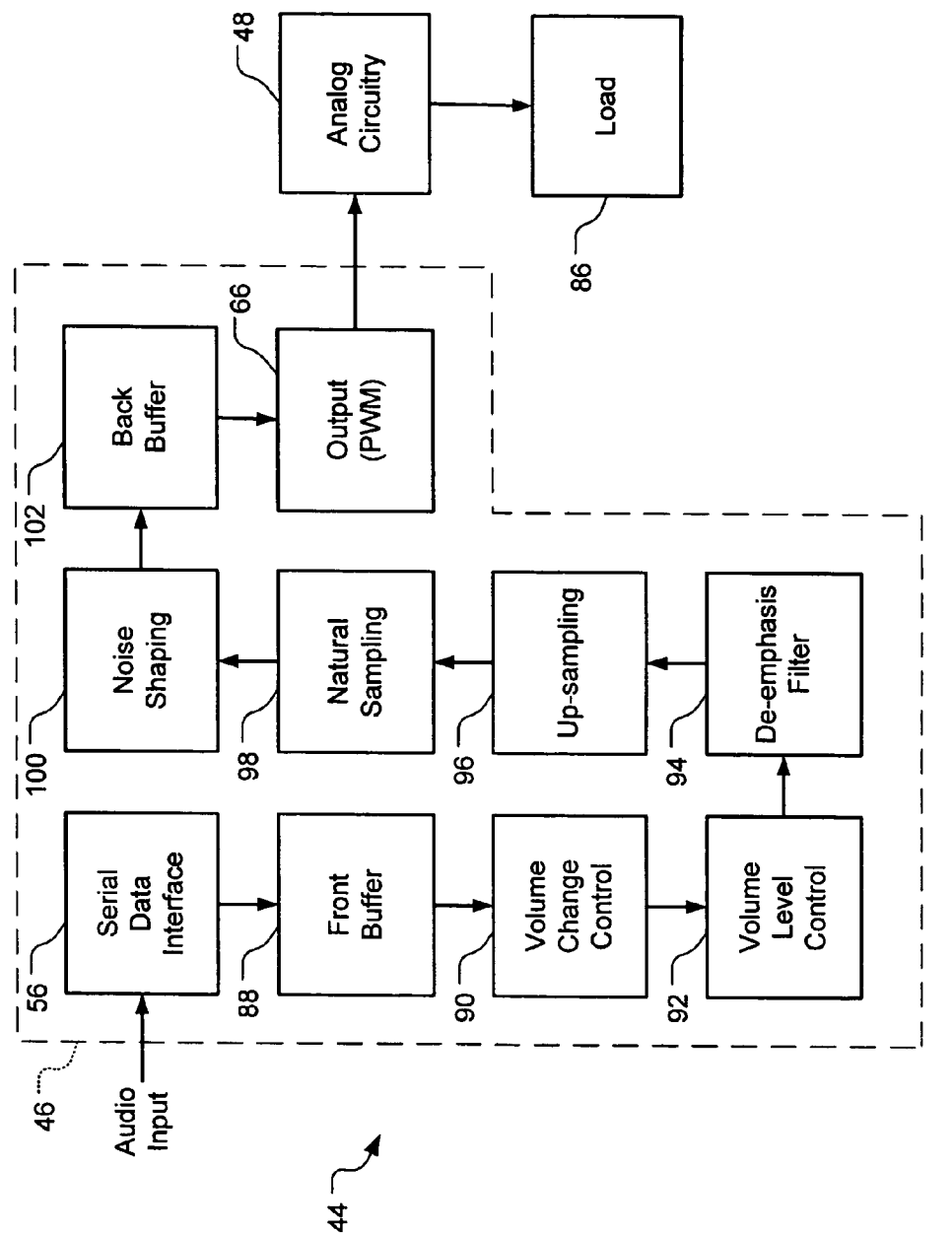
FIG. 5 is a functional block diagram of the DSP illustrated in further detail.

Referring now to FIG. 5, the DSP 46 receives an audio input signal and generates a PWM waveform that duplicates the content of the input signal. The analog module 48 receives the PWM waveform and generates an amplified waveform. A load module 86 includes an audio device such as a speaker and receives the amplified waveform to produce an audible signal. The serial data interface 56 transmits the input signal to a front buffer module 88. For example, the front buffer module 88 may be a first in first out (FIFO) buffer 88. The input signal is temporarily stored in the front buffer module 88 and read out by a volume change control module 90. The volume change control module 90 detects abrupt changes in the volume of the input signal. The volume change control module 90 ensures that the volume of the input signal gradually rolls from an off state to an on state and from an on state to an off state.

A volume level control module 92 receives the input signal from the volume change control module 90. The volume level control module 92 functions like a multiplier to control an overall volume of the input signal. The volume can be both increased and decreased. The input signal is then received by a de-emphasis filter 94. The de-emphasis filter 94 allows the amplifier 44 to be backward compatible with an audio signal that has been pre-emphasized. Therefore, the de-emphasis filter 94 offsets the pre-emphasis effect. An up-sampling module 96 optionally increases a frequency at which the input signal is sampled. For example, if the input signal was sampled at a frequency of 48 kHz, the up-sampling module 96 may up-sample the input signal to 2 times, 4 times, 8 times, or another multiple of the previous frequency.

A natural sampling module 98 samples the input signal in order to generate points that are used by the output module 66 to generate the PWM waveform. Since the analog module 48 does not have a relatively high resolution, a noise shaping module 100 reduces the resolution of the input signal. For example, without the noise shaping module 100, the PWM waveform generated by the output module 66 may have a resolution of 20 bits. Therefore, the noise shaping module 100 reduces the resolution to a level that is more compatible with the analog module 48.

The noise shaping module 100 maintains the resolution of noise in the audio band, and noise that is outside of the audio band is removed. Data from the noise shaping module 100 is temporarily stored in a back buffer 102. For example, the back buffer 102 may be a FIFO buffer. The output module 66 receives data from the back buffer 102 and generates a PWM waveform. The output module 66 transmits the PWM waveform to the analog module 48. Those skilled in the art can appreciate that the DSP 46 may include fewer or additional modules. Additionally, the order in which the modules are illustrated may be altered.

Figure 6:
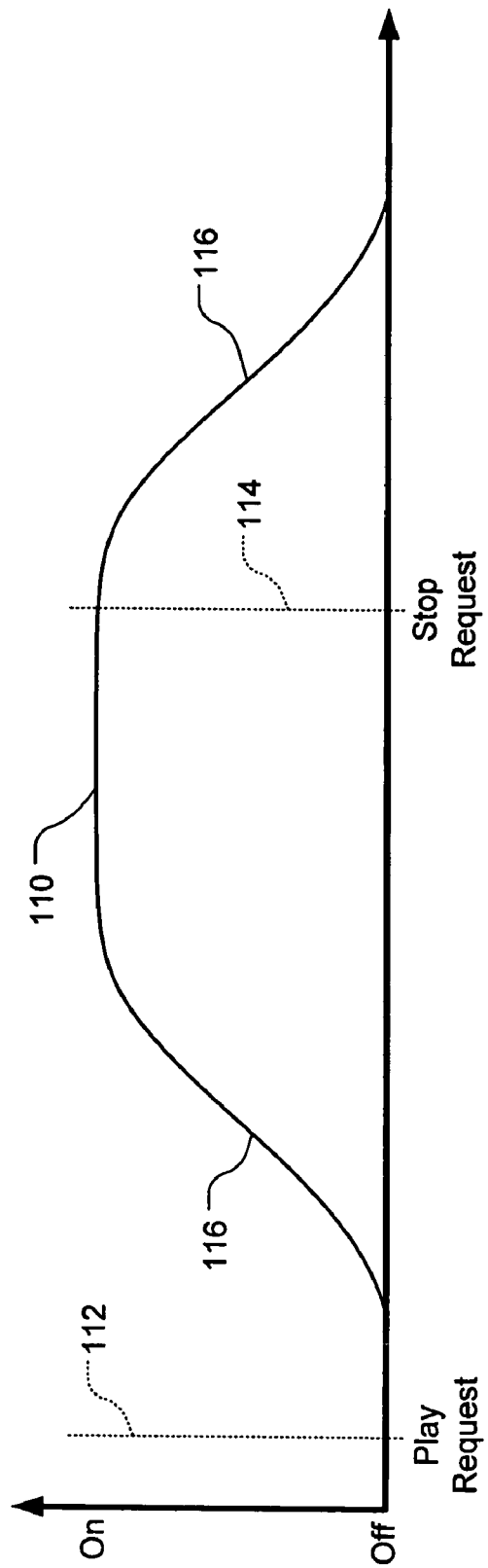
FIG. 6 is a graph illustrating the ability of the volume change control module to limit a rate of change of the volume of the input signal.

Referring now to FIG. 6, operation of the volume change control module 90 is illustrated. The volume change control module 90 converts abrupt changes in an audio signal 110 into gradually increasing or decreasing slopes. For example, following a play request 112, the audio signal 110 gradually rolls from an off state to an on state. Similarly, following a stop request 114, the audio signal 110 gradually rolls from the on state to the off state. Curves 116 in the signal are defined by $1+\cos(\alpha t)$, where $\alpha$ is programmable. In an exemplary embodiment, the curves 116 comprise 32 discreet steps that are each independently programmable in order to change the slope of the curve 116.

Additionally, the volume level control module 92 adjusts a volume coefficient of the input signal 110 in order to adjust the volume of the input signal 110. The volume level control module 92 ensures that the volume is changed slowly and in minimum increments. For example, the volume level control module 92 requires the volume to remain at each increment for a minimum number of cycles, which is programmable. Therefore, in order to change the volume 100 increments, the volume level control module 92 remains at each of the 100 increments for the minimum number of cycles.

Figure 7:
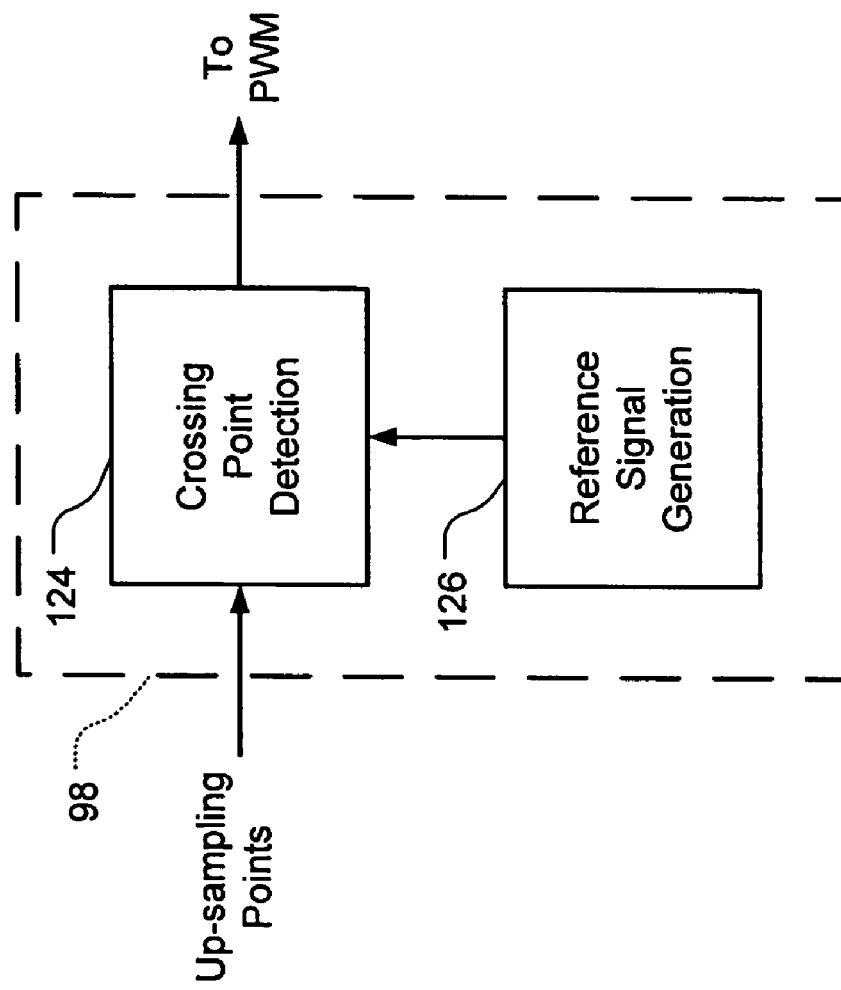
FIG. 7 is a functional block diagram of the natural sampling module including a reference signal generation module and a crossing point detection module.

Referring now to FIG. 7, the natural sampling module 98 includes a crossing point detection module 124 and a reference signal generation module 126. The reference signal generation module 126 generates a reference signal that is used to sample the audio signal. In an exemplary embodiment, the reference signal is a sawtooth waveform. The crossing point detection module 124 receives up-sampling points from the up-sampling module 96 and receives the reference signal. The crossing point detection module 124 generates intersection points of the audio signal and the reference signal that are used by the output module 66 to generate the PWM waveform. The crossing point detection module 124 utilizes the up-sampling points to regenerate the audio signal and to evaluate values of the audio signal at specified times.

Figure 8:
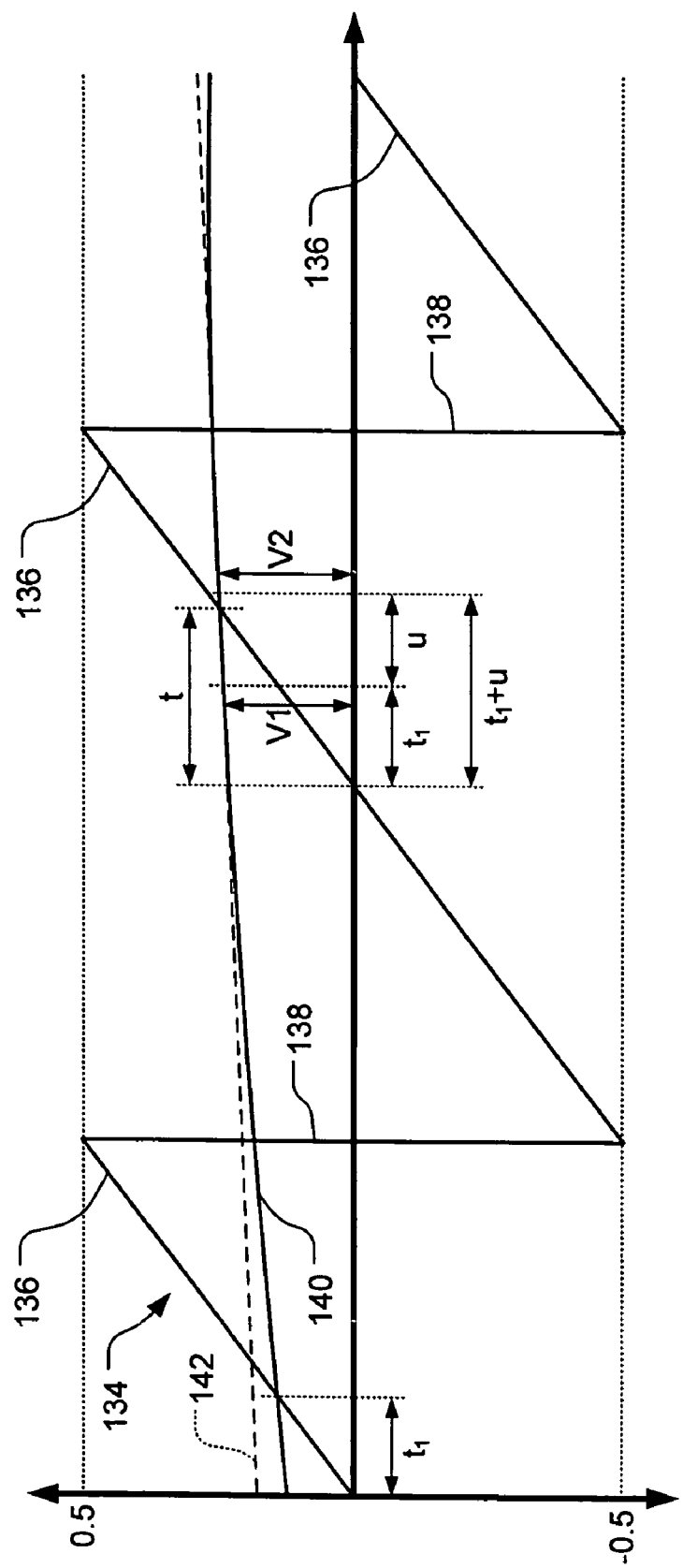
FIG. 8 is a graph illustrating detection of an intersection point of a digital input signal and a sawtooth waveform.

Referring now to FIG. 8, a sawtooth waveform 134 includes ramp portions 136 and portions 138 that are nearly vertical. The crossing point detection module 124 determines intersection points of an audio signal 140 and the ramp portions 136 of the sawtooth waveform 134. Uniform sampling occurs when sampling points are evenly spaced. Since the intersection points are determined with respect to the ramp portions 136 of the sawtooth waveform 134, the audio signal 140 is naturally sampled at non-uniformly spaced sampling points. The exemplary sawtooth waveform 134 illustrated in FIG. 8 has a constant frequency and varies between −0.5 and 0.5. For example, the frequency of the sawtooth waveform 134 may be 400 kHz, 800 Khz, 1.2 MHz, or another frequency.

The crossing point detection module 124 determines an intersection point of the input signal 140 and the sawtooth waveform 134 in each switching period of the sawtooth waveform 134. As used herein, a switching period of the sawtooth waveform 134 refers to a cycle of the sawtooth waveform 134. In an exemplary embodiment, the beginning of a new ramp portion 136 of the sawtooth waveform 134 identifies the beginning of a new switching period. The crossing point detection module 124 determines an intersection point in a current switching period with respect to a reference time in the current switching period. In an exemplary embodiment, the reference time in the current switching period is the time when the ramp portion 136 of the sawtooth waveform 134 is equal to zero. For example, in the switching period illustrated in FIG. 8, the intersection point is offset a time t from the reference time, wherein the sawtooth waveform 134 intersects the horizontal axis.

In an exemplary embodiment, the crossing point detection module 124 determines an intersection point in a current switching period based on a position of the intersection point from the previous switching period. For example, as shown in FIG. 8, the crossing point detection module 124 determines the amount of time $t_1$ that the intersection point from the previous switching period was offset from the previous reference time. The crossing point detection module 124 also determines whether the audio signal 140 was above or below the sawtooth waveform 134 at the previous reference time. The crossing point detection module 124 begins by offsetting that time $t_1$ from the reference time of the current switching period.

The crossing point detection module 124 offsets $t_1$ to the right of the current reference time when the audio signal 140 was greater than the sawtooth waveform 134 at the previous reference time. Likewise, the crossing point detection module 124 offsets $t_1$ to the left of the current reference time when the audio signal 140 was less than the sawtooth waveform 134 at the previous reference time. For example, in FIG. 8, the crossing points detection module 124 offsets $t_1$ to the right of the current reference time since the audio signal 140 was greater than the sawtooth waveform in the previous switching period.

The crossing point detection module 124 then evaluates the value V1 of the audio signal 140 at the time identified by the offset 1, in the current switching period. In an exemplary embodiment, the crossing point detection module 124 utilizes LaGrangian polynomial interpolation to evaluate the value V1 of the audio signal 140. The crossing point detection module 124 interpolates based on the up-sampling points from the up-sampling module 96 that correspond with points that are adjacent to the time of V1, as will be described in further detail below. The crossing point detection module 124 then offsets a fixed time u from the time of V1.

The crossing point detection module 124 offsets the fixed time u to the right of the time of V1 when the audio signal 140 is greater than the sawtooth waveform 134 at the time of V1. The crossing point detection module 124 offsets the fixed time u to the left of the time of V1 when the audio signal 140 is less than the sawtooth waveform 134 at the time of V1. The crossing point detection module 124 then evaluates the value V2 of the audio signal 140 at the time identified by the offset $t_1+/-u$. The crossing point detection module 124 then determines a function of a straight line 142 that extends between points on the audio signal 140 that correspond with the times of V1 and V2.

The crossing point detection module 124 estimates the intersection point of the audio signal 140 and the sawtooth waveform 134 in the current switching period as the intersection of the sawtooth waveform 134 and the straight line 142. As shown in FIG. 8, the intersection point is identified as being offset from the current reference time by t. The offset t is then used by the crossing point detection module 124 in order to determine an intersection point in a subsequent switching period. The audio signal 140 likely changes very little between switching periods relative to the frequency of the sawtooth waveform 134. Therefore, the intersection of the sawtooth waveform 134 and the straight line 142 provides a reliable estimation of the intersection point of the audio signal 140 and the ramp portion 136 of the sawtooth waveform 134.

Figure 9:
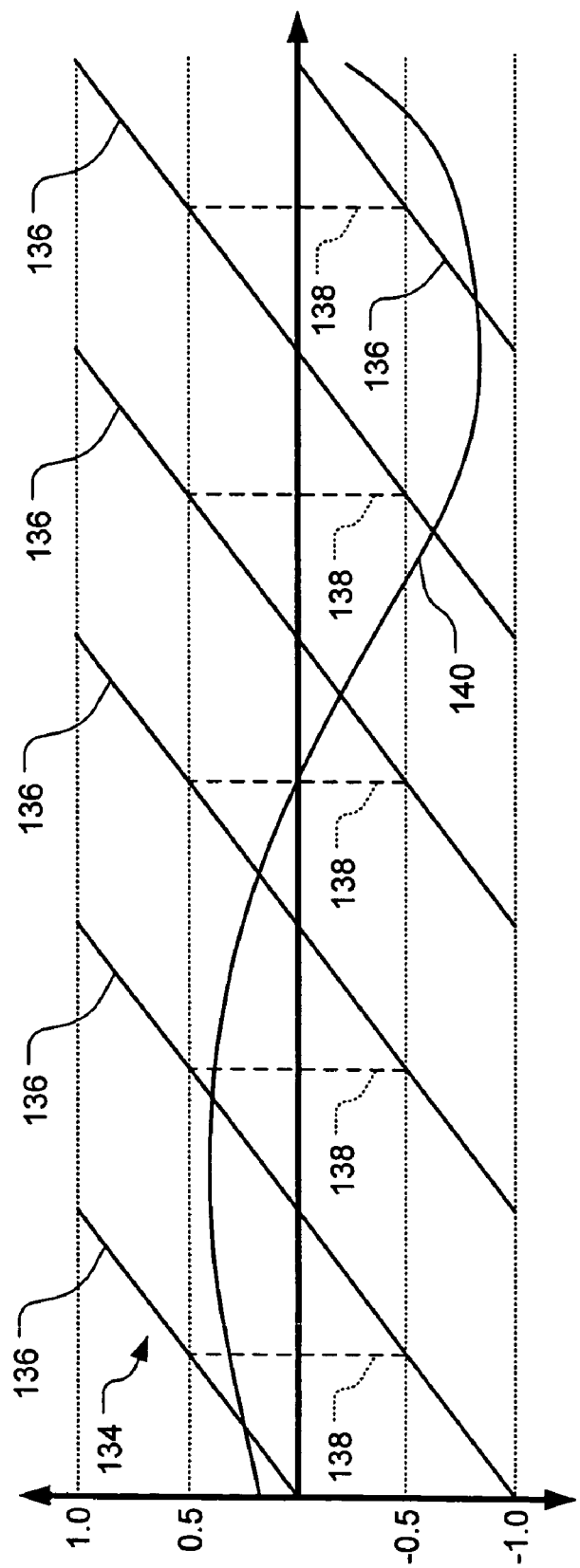
FIG. 9 is a graph illustrating an extended range of the input signal and overlapping sawtooth waveform switching periods.

Referring now to FIG. 9, an extended range of values for the audio signal 140 is illustrated. The range of the audio signal 140 in FIG. 8 is between −0.5 and 0.5. However, in an exemplary embodiment, the audio signal 140 ranges between −1.0 and 1.0. As discussed above, intersection points are located with respect to reference points in the same switching period. Therefore, the intersection point associated with a specific reference time can occur at any point along a ramp 136 of the sawtooth waveform 134, even if the intersection point crosses into an adjacent switching period. As shown in FIG. 9, the ramps 136 of the sawtooth waveform 134 overlap each other. Therefore, a sample point for a first switching period can extend into the boundary of a subsequent switching period, and a sample point for a second switching period can extend into a the boundary of a previous switching period.

As discussed above, the crossing point detection module 124 utilizes LaGrangian polynomial interpolation to evaluate the value of the audio signal 140 at the times of V1 and V2. In an exemplary embodiment, the crossing point detection module 124 utilizes the function $$g(x) = (1\, x^2\, x^3\, x^4) \begin{pmatrix} 0 & 1 & 0 & 0 \\ -\frac{1}{3} & -\frac{1}{2} & 1 & -\frac{1}{6} \\ \frac{1}{2} & -1 & \frac{1}{2} & 0 \\ -\frac{1}{6} & \frac{1}{2} & -\frac{1}{2} & \frac{1}{6} \end{pmatrix} \begin{pmatrix} y(-1) \\ y(0) \\ y(1) \\ y(2) \end{pmatrix}$$

to perform the interpolation operation. In the function, x is equal to $t_1$ and the y( . . . ) values are associated with the up-sampling points from the up-sampling module 96 that correspond with points that are adjacent to V1 and/or V2. The values of −1, 0, 1, and 2 represent time indices associated with the up-sampling points. The matrix is a typical $4^{th}$ order LaGrangian polynomial.

Since the up-sampling points alone do not represent a continuous line, the interpolation operation generates a continuous curve for the audio signal 140 from which to determine values of the audio signal 140. Once the values of the audio signal 140 at the times for V1 and V2 are determined, the offset t of the intersection point from the current reference time is computed. First, the slope k of the straight line 142 is determined according to $$k = \frac{V2 - V1}{u}.$$

Then, t is approximated as a polynomial using a Taylor series expansion according to $$t = \frac{V1 - kxt_1}{1-k} \approx V1 + (V1 - t_1)k(1 + k + k^2 + k^3 + k^4).$$

Figure 10:
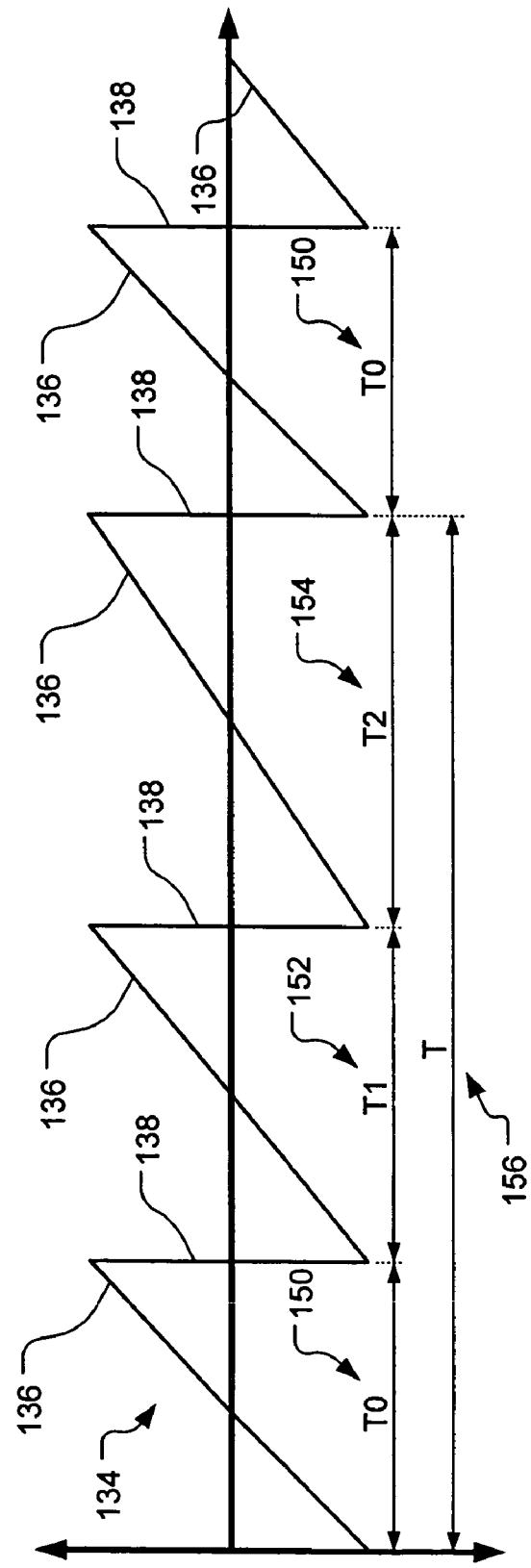
FIG. 10 is a graph illustrating a sawtooth waveform for spread spectrum natural sampling.

Referring now to FIG. 10, in an exemplary embodiment, the frequency of the sawtooth waveform 134 is variable. In this case, the sawtooth waveform 134 includes at least two switching periods having durations that are not equal. For example, the sawtooth waveform 134 illustrated in FIG. 10 includes three switching periods having different durations. The variable frequency of the sawtooth waveform 134 requires spread spectrum mode natural sampling to determine intersection points of the audio signal 140 and ramps 136 of the sawtooth waveform 134. The durations of the switching periods in FIG. 10 are identified as either T0 150, T1 152, or T2 154.

If T0 150 is defined as T1−dT and T2 154 is defined as T1+dT, the grouped period T 156 shown in FIG. 10 is equal to 3×T1×N, where N is equal to the number of times that T0 150 is repeated. For example, since T0 150 is repeated once in the grouped period T 156, N is equal to 1 in FIG. 10. Additionally, the total period may be expressed as one or more of the switching periods repeated a specific number of times. For example, the total period 156 may be expressed as $(T_{0N}, T_{1N}, T_{2N})$ to indicate the number of times that T0 150, T1 152, and/or T2 154, respectively, are repeated. Each of the switching periods in the grouped period 156 repeat the number of times indicated by respective N values. The pattern of the grouped period is then repeated.

The sawtooth waveform 134 typically has a much higher frequency than the audio signal 140. As a result, the frequency of the sawtooth waveform 134 may exist as a peak in the output audio signal 140 spectrum. It may be undesirable for the peak to exist too high in the signal spectrum. Therefore, by utilizing spread spectrum natural sampling, the frequency of the sawtooth waveform 134 is varied and shows up in the output audio signal spectrum as much lower and wider than in the case of a constant frequency.

The algorithm used by the crossing point detection module 124 is altered to account for the varying frequency of the sawtooth waveform 134. The time offset $t_1$ where the value V1 of the audio signal is first evaluated is no longer offset from the current reference time. Instead, the crossing point detection module 124 computes the average of the durations of the current and previous switching periods. The crossing point detection module 124 then offsets the average time from the time of the intersection point from the previous switching period. The offset is an approximation of the intersection point for the current switching period. The offset is also used as the first evaluation time for the current switching period to determine the value V1 of the audio signal. Once the first evaluation time is set, the algorithm proceeds as in the case of a constant frequency for the sawtooth waveform 134. Therefore, the crossing point detection module 124 first determines whether durations of adjacent switching periods are equal before determining the location of the first evaluation time.

Figure 11:
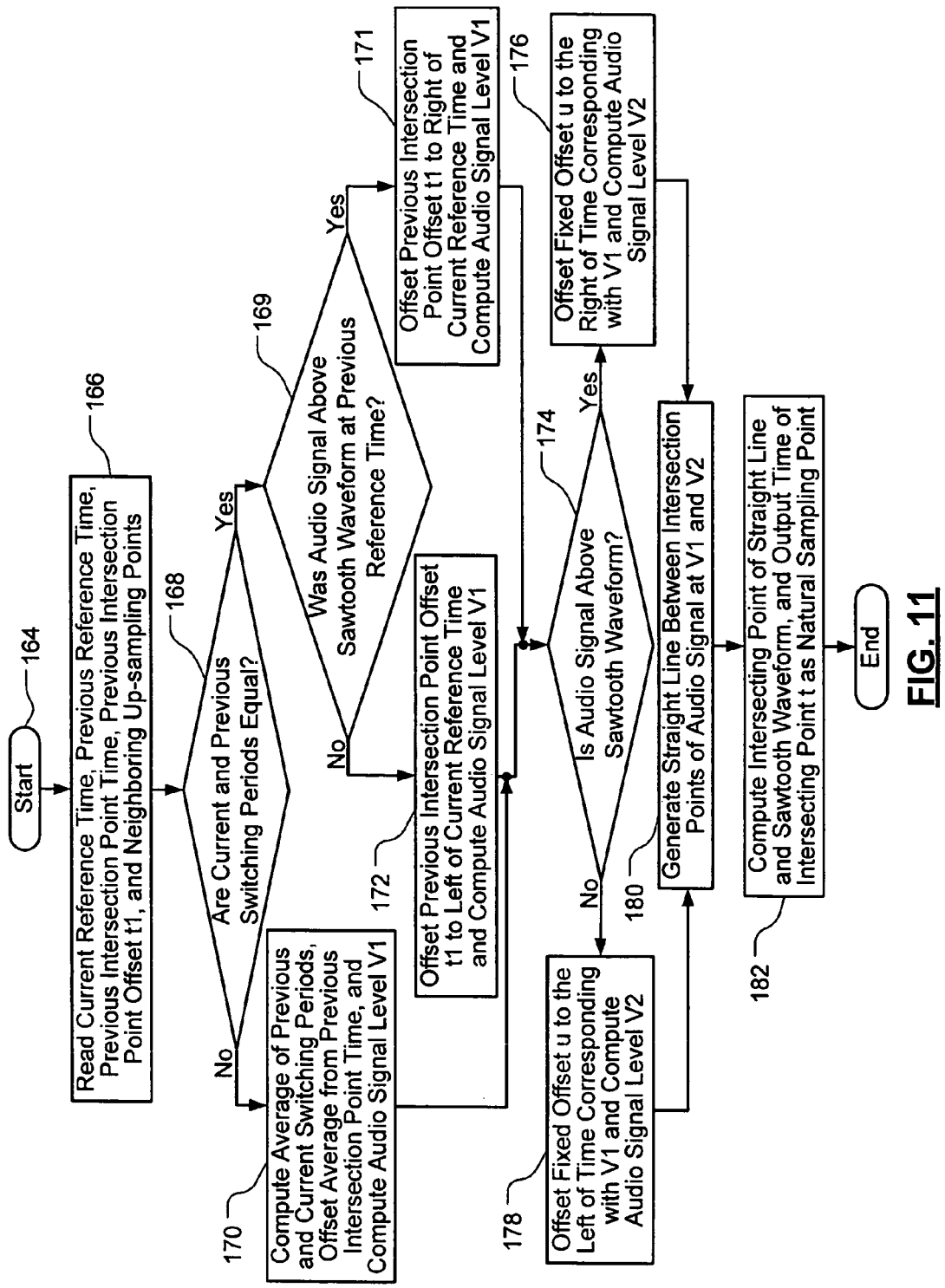
FIG. 11 is a flowchart illustrating steps performed by the crossing point detection module to determine intersection points of the input signal and the reference signal.

Referring now to FIG. 11, a crossing point detection algorithm begins in step 164. In step 166, the crossing point detection module 124 reads the reference time from the current switching period and the reference time from the previous switching period. The crossing point detection module 124 also reads the time of the intersection point from the previous switching period, the amount of time $t_1$ between the reference time and intersection point from the previous switching period, and the up-sampling points in step 166. In step 168, control determines whether the current and previous switching periods are of an equal duration. If true, control proceeds to step 169. If false, control proceeds to step 170.

In step 170, the crossing point detection module 124 computes the average duration of the previous and current switching periods and offsets the average from the time of the intersection point from the previous switching period. The crossing point detection module 124 also computes the level V1 of the audio signal 140 in step 170. In step 169, control determines whether the audio signal 140 was above the sawtooth waveform 134 at the reference time from the previous switching period. If true, control proceeds to step 171. If false, control proceeds to step 172. In step 171, the crossing point detection module 124 offsets the time offset $t_1$ to the right of the current reference time and computes the level V1 of the audio signal 140. In step 172, the crossing point detection module 124 offsets the time offset $t_1$ to the left of the current reference time and computes the level V1 of the audio signal 140. Steps 170, 171, and 172 all proceed step 174.

In step 174, control determines whether the audio signal 140 is above the sawtooth waveform 134 at the time of V1. If true, control proceeds to step 176. If false, control proceeds to step 178. In step 176, the crossing point detection module 124 offsets the fixed offset u to the right of the time of V1 and computes the level V2 of the audio signal 140. In step 178, the crossing point detection module 124 offsets the fixed offset u to the left of the time of V1 and computes the level V2 of the audio signal 140. Both step 176 and step 178 proceed to step 180.

In step 180, the crossing point detection module 124 generates a straight line 142 between points on the audio signal 140 at the times of V1 and V2. In step 182, the crossing point detection module 124 computes the intersection point of the straight line 142 and the sawtooth waveform 134 and outputs the time of the intersection point as a natural sampling point and control ends.

Figure 12:
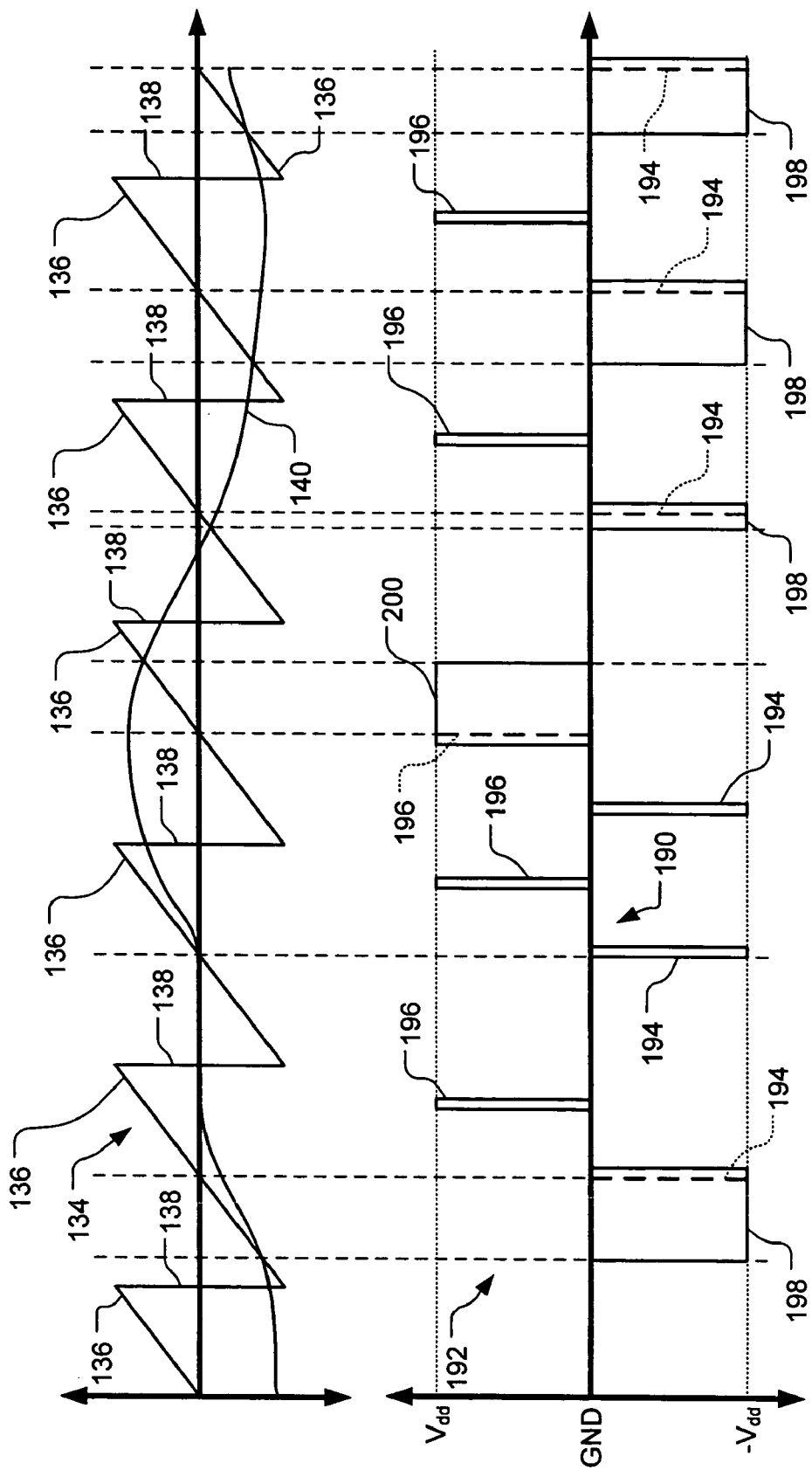
FIG. 12 is a graph illustrating an exemplary digital input signal that is sampled and converted into a PWM waveform including a minimum pulse that is added to each of the pulses in the PWM waveform.

Referring now to FIG. 12, a portion of the audio signal 140 has a near zero level and intersects a ramp portion 136 of the sawtooth waveform 134 while close to zero. In a conventional output module 66, this translates into a pulse with a near-zero width. Pulses with such a short duration may adversely affect components in the analog module 48. Therefore, the output module 66 utilizes a minimum pulse width. The output module 66 adds an additional pulse waveform 190 to every pulse to ensure that all pulses maintain a minimum width. For example, if the audio signal 140 intersects a ramp 136 of the sawtooth waveform 134 at a near-zero level as shown in FIG. 12, the output module 66 generates a PWM waveform 192 having a pulse 190 with a minimum width no matter how close the intersection point is to the reference time. In an exemplary embodiment, the minimum pulse comprises a negative pulse 194 followed by a positive pulse 196. The negative and positive pulses 194 and 196, respectively, each have a programmable width and are separated by a pulse margin that is programmable.

The minimum pulse is added to the beginning of pulses that are positive and to the end of pulses that are negative. Therefore, the negative pulse 194 of the minimum pulse has the effect of increasing the width of an original negative pulse 198. Likewise, the positive pulse 196 of the minimum pulse has the effect of increasing the width of an original positive pulse 200. In an exemplary embodiment, pulses 190 that are the result of the audio signal 140 intersecting a ramp portion 136 of the sawtooth waveform 134 at a zero level are identified as negative pulses. Therefore, pulses 190 associated with these points only include the negative pulse 194 and the positive pulse 196.

In an another exemplary embodiment, the output module 66 varies the margin between consecutive pairs of the positive and negative pulses 194 and 196, respectively. For example, a first negative/positive pulse pair 194/196 of a first pulse may be separated by 10 cycles, and a second negative/positive pulse pair 194/196 is separated by 11 cycles. The fluctuating margin may increase up to a predetermined value and then restart with the first value. Alternatively, the margin may increase to the predetermined value and then decrease back to the first value.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. A digital signal processor (DSP), comprising:
an up-sampling module configured to sample an input signal and generate up-sampling points; and
a natural sampling module comprising
a reference signal generation module configured to generate a reference signal, and
a crossing point detection module configured to
(i) receive the up-sampling points and the reference signal,
(ii) use interpolation to detect intersection points of the input signal and the reference signal,
(iii) determine a first value of the input signal at a first evaluation time,
(iv) determine a second value of the input signal at a second evaluation time, and
(v) estimate a current intersection point of the input signal and the reference signal as an intersection point of the reference signal and a line, wherein the line extends between a first point and a second point on the input signal, wherein the first point corresponds with the first evaluation time, and wherein the second point corresponds with the second evaluation time.

2. The DSP of claim 1, wherein:
the first evaluation time is offset from a current reference time by a first time offset; and
the first time offset is equal to a difference between (i) a time of a previous intersection point of the input signal and the reference signal in a previous switching period of the reference signal and (ii) a previous reference time in the previous switching period.

3. The DSP of claim 2, wherein a frequency of the reference signal is variable.

4. The DSP of claim 1, wherein the second evaluation time is offset from the first evaluation time by a second time offset.

5. The DSP of claim 1, wherein the input signal is a digital audio signal.

6. The DSP of claim 1, wherein a frequency of the reference signal is constant.

7. The DSP of claim 1, wherein:
the reference signal is a sawtooth waveform; and
the intersection points are points where the input signal intersects ramp portions of the sawtooth waveform.

8. The DSP of claim 1, wherein the crossing point detection module is configured to use LaGrangian polynomial interpolation to determine the first value and the second value of the input signal based on the up-sampling points.

9. The DSP of claim 1, further comprising a pulse width modulation (PWM) module configured to (i) receive the intersection points of the reference signal and the input signal and (ii) convert the intersection points into a PWM waveform having pulses with pulse widths corresponding to differences between times of the intersection points and respective reference times.

10. The DSP of claim 9, wherein:
the pulses are negative when values of the input signal at the intersection points are less than or equal to zero; and
the pulses are positive when values of the input signal at the intersection points are greater than zero.

11. The DSP of claim 9, wherein the PWM module is configured to add an additional pulse waveform to each of the pulses.

12. The DSP of claim 11, wherein a first pulse includes only the additional pulse waveform when a value of the input signal at an intersection point associated with the first pulse is equal to zero.

13. The DSP of claim 11, wherein the PWM module adds the additional pulse waveform to (i) beginnings of positive pulses and (ii) ends of negative pulses.

14. The DSP of claim 11, wherein:
the additional pulse waveform includes a first pulse and a second pulse;
the first pulse is negative;
the second pulse is positive;
the first pulse and the second pulse have predetermined pulse widths; and
the first pulse and the second pulse are separated by an adjustable predetermined amount of time.

15. The DSP of claim 14, wherein:
the first pulse increases pulse widths of pulses that are negative; and
the second pulse increases pulse widths of pulses that are positive.

16. The DSP of claim 14, wherein the predetermined amount of time between the first pulse and the second pulse varies between (i) a first occurrence of the first pulse and the second pulse and (ii) a second occurrence of the first pulse and the second pulse in the PWM waveform.

17. The DSP of claim 2, wherein:
the first evaluation time is subsequent to the current reference time when the input signal is greater than the reference signal at the previous reference time; and
the first evaluation time is prior to the current reference time when the input signal is less than the reference signal at the previous reference time.

18. The DSP of claim 1, wherein:
the second evaluation time is prior to the first evaluation time when the input signal is less than the reference signal at the first evaluation time; and
the second evaluation time is subsequent to the first evaluation time when the input signal is greater than the reference signal at the first evaluation time.

19. The DSP of claim 2, wherein the current reference time and the previous reference time occur at points on the reference signal where a value of the reference signal is equal to zero.

20. The DSP of claim 2, wherein:
a third evaluation time in a subsequent switching period of the reference signal is offset from a subsequent reference time in the subsequent switching period by a second time offset; and
the second time offset is equal to a difference between a time of the current intersection point and the current reference time.

21. The DSP of claim 1, wherein:
a frequency of the reference signal is variable;
a duration of a current switching period of the reference signal is not equal to a duration of a previous switching period of the reference signal;
the first evaluation time is offset from a time of a previous intersection point of the reference signal and the input signal in the previous switching period by a first time offset; and
the first time offset is equal to an average of (i) the duration of the current switching period and (ii) the duration of the previous switching period.

22. A digital Class-D amplifier comprising the DSP of claim 1.

23. A method for operating a digital signal processor (DSP), comprising:
up-sampling an input signal;
generating up-sampling points;
generating a reference signal;

using interpolation based on the up-sampling points to detect intersection points of the input signal and the reference signal;

determining a first value of the input signal at a first evaluation time;

determining a second value of the input signal at a second evaluation time; and estimating a current intersection point of the input signal and the reference signal as an intersection point of the reference signal and a line, wherein the line extends between a first point and a second point on the input signal, wherein the first point corresponds with the first evaluation time, and wherein the second point corresponds with the second evaluation time.

24. The method of claim 23, further comprising:
offsetting the first evaluation time from a current reference time by a first time offset; and
setting the first time offset equal to a difference between (i) a time of a previous intersection point of the input signal and the reference signal in a previous switching period of the reference signal and (ii) a previous reference time in the previous switching period.

25. The method of claim 24, wherein a frequency of the reference signal is variable.

26. The method of claim 23, further comprising offsetting the second evaluation time from the first evaluation time by a second time offset.

27. The method of claim 23, wherein the input signal is a digital audio signal.

28. The method of claim 23, wherein a frequency of the reference signal is constant.

29. The method of claim 23, wherein:
the reference signal is a sawtooth waveform; and
the intersection points are points where the input signal intersects ramp portions of the sawtooth waveform.

30. The method of claim 23, further comprising using LaGrangian polynomial interpolation to determine the first value and the second value of the input signal based on the up-sampling points.

31. The method of claim 23, further comprising converting the intersection points into a PWM waveform having pulses with pulse widths, wherein the pulse widths correspond with differences between times of the intersection points and respective reference times.

32. The method of claim 31, further comprising:
generating negative pulses when values of the input signal at the intersection points are less than or equal to zero; and
generating positive pulses when values of the input signal at the intersection points are greater than zero.

33. The method of claim 31, further comprising adding an additional pulse waveform to each of the pulses.

34. The method of claim 33, wherein a first pulse includes only the additional pulse waveform when a value of the input signal at an intersection point associated with the first pulse is equal to zero.

35. The method of claim 33, further comprising adding the additional pulse waveform to (i) beginnings of positive pulses and (ii) ends of negative pulses.

36. The method of claim 33, wherein:
the additional pulse waveform includes a first pulse and a second pulse;
the first pulse is negative;
the second pulse is positive;
the first pulse and the second pulse have predetermined pulse widths; and
the first pulse and the second pulse are separated by an adjustable predetermined amount of time.

37. The method of claim 36, further comprising:
increasing pulse widths of pulses that are negative with the first pulse; and
increasing pulse widths of pulses that are positive with the second pulse.

38. The method of claim 36, further comprising varying the predetermined amount of time between the first and second pulses between (i) a first occurrence of the first and second pulses and (ii) a second occurrence of the first and second pulses in the PWM waveform.

39. The method of claim 24, wherein:
the first evaluation time is subsequent to the current reference time when the input signal is greater than the reference signal at the previous reference time; and
the first evaluation time is prior to the current reference time when the input signal is less than the reference signal at the previous reference time.

40. The method of claim 23, wherein:
the second evaluation time is prior to the first evaluation time when the input signal is less than the reference signal at the first evaluation time; and
the second evaluation time is subsequent to the first evaluation time when the input signal is greater than the reference signal at the first evaluation time.

41. The method of claim 24, wherein the current reference time and the previous reference time occur at points on the reference signal where a value of the reference signal is equal to zero.

42. The method of claim 24, further comprising:
offsetting a third evaluation time in a subsequent switching period of the reference signal from a subsequent reference time in the subsequent switching period by a second time offset; and
setting the second time offset equal to a difference between (i) a time of the current intersection point and (ii) the current reference time.

43. The method of claim 23, wherein:
a frequency of the reference signal is variable;
a duration of a current switching period of the reference signal is not equal to a duration of a previous switching period of the reference signal
the first evaluation time is offset from a time of a previous intersection point of the reference signal and the input signal in the previous switching period by a first time offset; and
the first time offset is equal to an average of (i) the duration of the current switching period and (ii) the duration of the previous switching period.

44. The method of claim 23, further comprising integrating the DSP in a digital Class-D amplifier.

* * * * *